(12) United States Patent
Kreisel et al.

(10) Patent No.: US 12,136,916 B2
(45) Date of Patent: Nov. 5, 2024

(54) OPERATOR CONTROL UNIT FOR A MEASURING INSTRUMENT FOR PROCESS OR AUTOMATION ENGINEERING, AND MEASURING INSTRUMENT HAVING AN OPERATOR CONTROL UNIT OF THIS KIND

(71) Applicant: IFM Electronic gmbH, Essen (DE)

(72) Inventors: Christian Kreisel, Neukirch (DE); Patrick Werner, Stetten (DE); Walter Reichart, Fronreute (DE); Tobias May, Meckenbeuren (DE)

(73) Assignee: IFM Electronic GmbH, Essen (DE)

( * ) Notice: Subject to any disclaimer, the term of this patent is extended or adjusted under 35 U.S.C. 154(b) by 243 days.

(21) Appl. No.: 17/615,828

(22) PCT Filed: May 27, 2020

(86) PCT No.: PCT/EP2020/064623
§ 371 (c)(1),
(2) Date: Dec. 1, 2021

(87) PCT Pub. No.: WO2020/244976
PCT Pub. Date: Dec. 10, 2020

(65) Prior Publication Data
US 2022/0329243 A1 Oct. 13, 2022

(30) Foreign Application Priority Data
Jun. 3, 2019 (DE) .......................... 102019114757.3

(51) Int. Cl.
*H03K 17/975* (2006.01)

(52) U.S. Cl.
CPC ... *H03K 17/975* (2013.01); *H03K 2217/9651* (2013.01)

(58) Field of Classification Search
CPC ....... H03K 2217/96; H03K 2217/9651; H03K 17/97; H03K 17/975; H01H 2009/02;
(Continued)

(56) References Cited

U.S. PATENT DOCUMENTS

| 5,086,652 A | 2/1992 | Kropp |
| 2015/0163937 A1 | 6/2015 | McClatchie et al. |

FOREIGN PATENT DOCUMENTS

| DE | 10 2011 075 942 A1 | 5/2013 |
| DE | 10 2014 206 486 A1 | 7/2015 |

*Primary Examiner* — Anthony R Jimenez
(74) *Attorney, Agent, or Firm* — Patent Technologies, LLC; Robert D. Gunderman, Jr.

(57) ABSTRACT

The invention relates to an operator control unit for a measuring instrument for process or automation engineering, the operator control unit consisting of at least two adjacently arranged control panels (10a), the control panels (10a) being operated by pressing on a respective shape-variable or elastic housing region (2a) having a respective capacitive sensor element (11) disposed thereunder. The sensor elements (11) each have a first electrode (11a) as a lower plate capacitor and a counter-electrode (11b) arranged in parallel thereabove as an upper plate capacitor, and pressing on one of the housing regions (2a) causes the respective upper plate capacitor (11b) to approach the respective lower plate capacitor (11a), thus changing the capacitance. The first electrode (11a) is attached to a first carrier material (12) and the counter-electrode (11b) is attached to a second carrier material (13). According to the invention, the housing regions (2a) are arranged adjacently to one another in an uninterrupted manner, and the sensor elements (11) are parts of a multi-layered composite printed circuit board (100), which bears against the inner sides of the housing regions (2a), wherein the composite printed circuit board (100) comprises at least the first carrier material (12), which consists of a plurality of segments of rigid circuit
(Continued)

Figure 5:
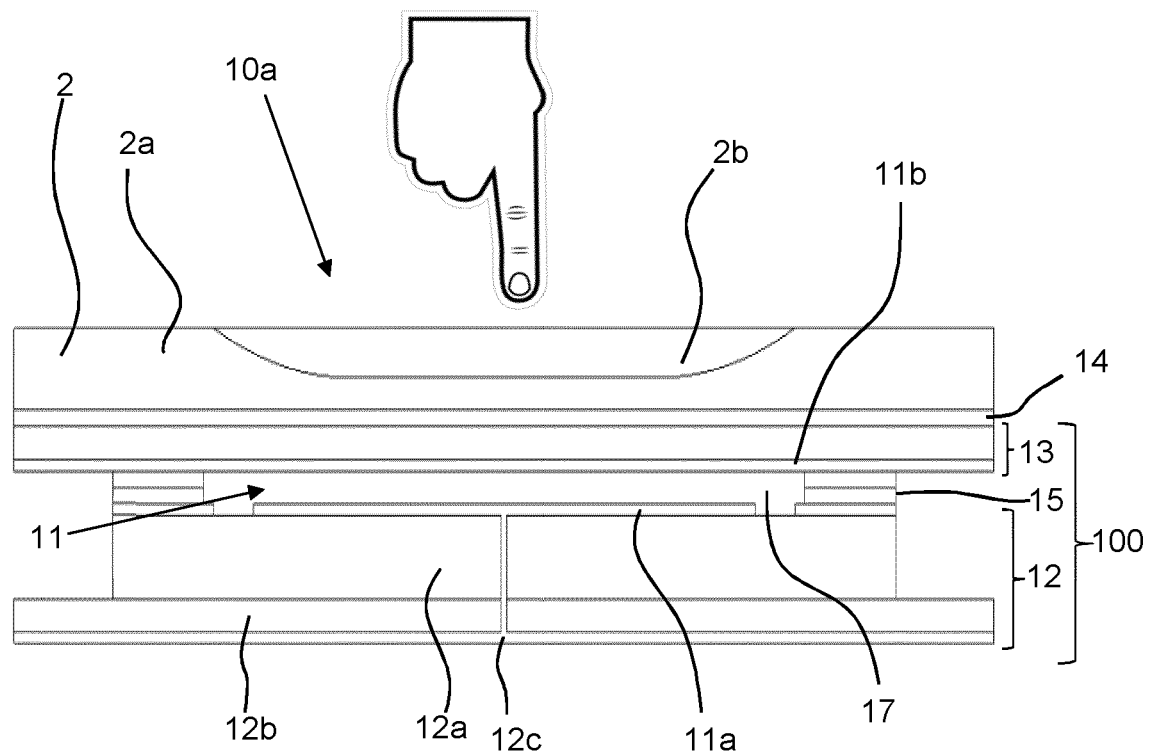

boards each with flexible intermediate pieces arranged therebetween, and the second carrier material (13) in the form of a conductive layer, which two carrier materials are spaced apart from one another via an interposed plastic layer (15), forming a measuring chamber (17), and wherein the plastic layer (15) has a plurality of interruptions for forming the sensor elements (11) and a decoupling region (16) between the control panels (10*a*).

8 Claims, 2 Drawing Sheets

(58) Field of Classification Search
CPC ....... H01H 2009/0285; H01H 2013/00; H01H 2013/02; H01H 2013/04; H01H 2013/50; H01H 2211/006; H01H 2211/024; H01H 2221/00; H01H 2221/002; H01H 2221/09; H01H 2223/01; H01H 2231/016; H01H 2231/012; H01H 2239/00; H01H 2239/006; H01H 2239/01; H01H 1/5822; H01H 3/00; H01H 3/02; H01H 3/12; H01H 9/00; H01H 9/02; H01H 13/00; H01H 13/04; H01H 13/14; H01H 13/70; H01H 13/702; H01H 13/703; H01H 13/705; H01H 2003/12
USPC ......................................................... 200/600
See application file for complete search history.

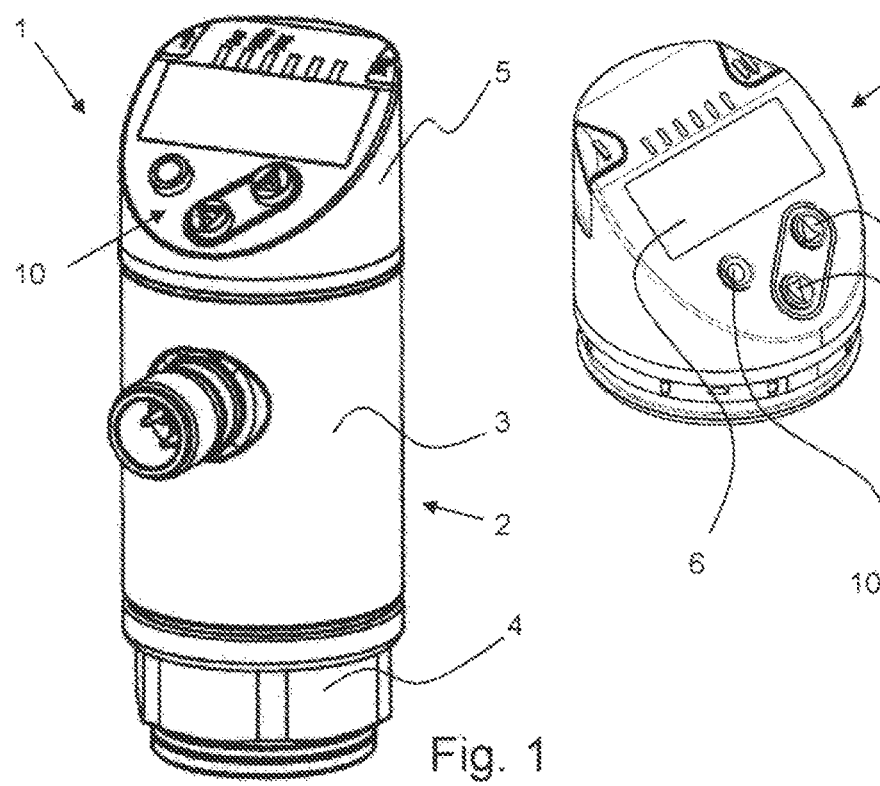
Fig. 1
Fig. 2
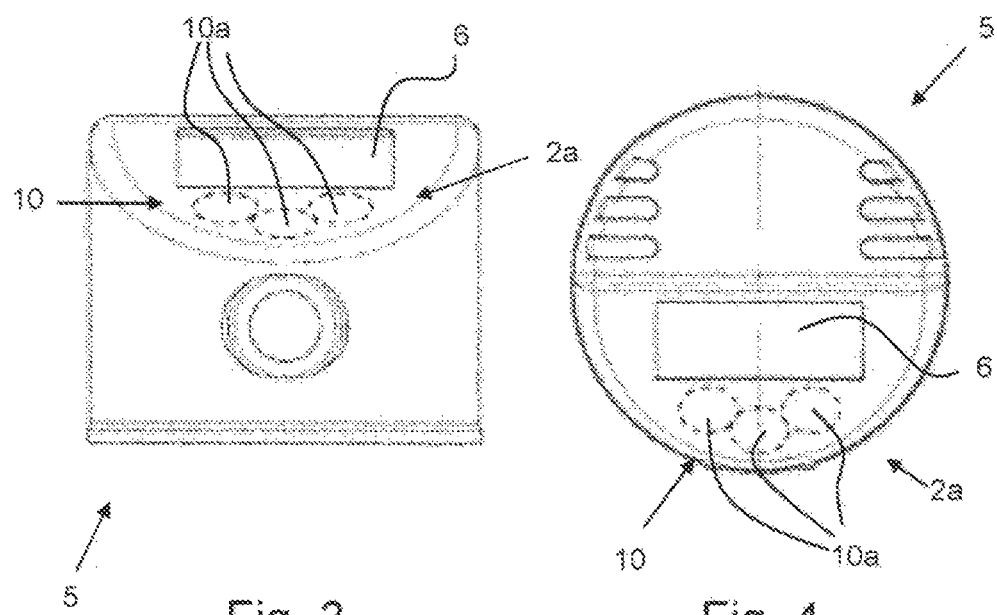
Fig. 3
Fig. 4

OPERATOR CONTROL UNIT FOR A MEASURING INSTRUMENT FOR PROCESS OR AUTOMATION ENGINEERING, AND MEASURING INSTRUMENT HAVING AN OPERATOR CONTROL UNIT OF THIS KIND

The invention relates to an operator control unit for a measuring instrument in the field of process or automation engineering as well as a measuring instrument having an operator control unit of this kind.

In automation and process engineering, sensors and measuring instruments are often used, which transmit the measured value—e.g. pressure, temperature, flow rate, but also distance or vibration—into an output signal representing this measured value in the form of an analog or digital current or voltage signal and provide this signal at their cable or plug connection, but sometimes also wirelessly, to a higher-level control unit, e.g. a PLC, for further processing.

A typical measuring instrument primarily consists of a sensor element, also referred to as a transducer, which is used to detect and convert a physical measured variable of a process value into a measurement signal. Furthermore, an evaluation unit is provided, which is often implemented as a microcontroller and in which the measurement signals generated by the sensor element are conditioned, i.e. amplified, and usually also already processed. At the output side, the evaluation unit is connected both to a display unit and to a communication interface, via which the conditioned measurement signals can be transmitted to the aforementioned control unit. The current measured values are displayed on the display unit. Furthermore, the display unit is often also used for setting up and parameterizing the measuring instrument. For this purpose, the measuring instrument also comprises corresponding input options. In typical measuring instruments of the type in question, these input options are designed as operating keys, the actuation of which influences a micro pushbutton. In this respect reference is made, for example, to DE 102014206486A1.

Apart from mechanical switches and pushbutton, various possibilities are known for operating devices solely by touching them through the closed housing wall. For example, magnetic actuation is known in which a reed contact inside the device is actuated by a magnet movably attached to the outside of the housing. Furthermore, an optically reflective actuation through a transparent housing wall, for example a glass pane of a display instrument, is known. The optically reflective actuation is regularly used in the field of indicators. For example, from DE 102005048021 B3 an automation device is known which can be operated locally by means of a passive infrared sensor.

However, all these switches and pushbuttons require an interruption of the housing, in which e.g. a glass pane or the like is inserted, resulting in problems of tightness, or a complex structure, e.g. in the form of magnets, attached to the outside of the housing.

From the German patent specification DE 102013225076 B4 it is known to detect a keystroke through the closed housing wall, namely according to the calorimetric principle, by touching a sensitive surface provided on the housing wall. In this case, the temperature change caused by touching the sensitive surface as a result of the heat transport that occurs is determined.

US 2013/0126325 A1 discloses an operator control unit of an electronic device by means of capacitive touch sensors. By depressing a deformable area of metal the capacitance value of the capacitive sensor changes so that a keystroke can be detested as a result. However, the solution shown there can only be applied to operator control units or control panels with very thin housing thicknesses. In the case of the measuring instruments in question, which are intended for use in automation and process engineering, their housings must be designed correspondingly thicker and thus more stable in order to withstand the often very harsh industrial conditions.

From DE 102011075942 A1 an operating device for an electrical appliance is known. The operating device comprises uninterrupted housing areas, a multilayer conductor composite and a plastic layer which comprises several interruptions and forms a measuring chamber.

From U.S. Pat. No. 5,086,652 A1 a touch sensor for measuring forces at multiple positions is known, in which the individual sensors are interconnected by flexible layers of Mylar polyester.

It is the object of the invention to provide an alternative possibility to operate a measuring instrument of the type mentioned above through a robust closed housing wall.

This object is achieved according to the invention by an operator control unit with the features of claim 1 as well as by a measuring instrument of process or automation engineering with the features of claim 8, which comprises an operator control unit of this kind. Advantageous embodiments of the invention are indicated in the subclaims.

The measuring instrument is operated by pressing on one of the control panels of the operator control unit in the form of shape-variable or elastic housing regions. A capacitive sensor element is respectively arranged under the housing regions. The sensor elements each comprise a first electrode as a lower capacitor plate and a counter-electrode arranged parallel thereabove as an upper capacitor plate. Pressing on one of the housing regions causes the respective upper capacitor plate to approach the respective lower capacitor plate, whereby a change in capacitance is triggered.

The first electrode is deposited on a first carrier material and the counter electrode is deposited on a second carrier material. According to an advantageous further development, the elastic housing regions each comprise a partial weakening in the area of the upper capacitor plate, which are each formed as a haptically perceptible depression of the outer housing wall.

It is essential to the invention that the housing regions—and thus the housing of the measuring instrument as a whole—are arranged adjacent to each other without interruption and that the sensor elements are parts of a multilayer printed circuit board composite which abuts against the inner sides of the housing regions. Preferably the housing regions are formed from a metal, although other suitable materials such as plastics may also be considered. The housing of the measuring instrument can thus advantageously be designed as a deep-drawn part, which significantly reduces the manufacturing costs, and the printed circuit board composite is bonded to the inner sides of the housing regions, for example, firmly bonded, preferably by means of an adhesive bond, or alternatively pressed by means of a clamping device against the inner sides of the housing regions, i.e. in one piece across all control panels. This ensures a permanent and firm connection between the housing regions and the printed circuit board composite.

The printed circuit board composite comprises at least the first carrier material, which consists of several segments of rigid printed circuit boards with flexible intermediate pieces arranged between them and is preferably designed as a flex-rigid printed circuit board, and the second carrier material in the form of a conductive layer, which is preferably designed as a conductor film, both of which are spaced apart from one another by means of an interposed plastic layer. The plastic layer comprises several interruptions to form the sensor elements and a decoupling area between the operator control units. In the present context, a conductor film is understood to be a polyimide substrate with structured conductor tracks, while a flex-rigid printed circuit board is a composite of several segments of conventional, rigid printed circuit boards, each of which are connected to one another by means of a film-like and thus flexible intermediate piece.

Both the manufacture of the printed circuit board composite described and its installation in the measuring instrument are comparatively simple, so that the invention, in particular in combination with a measuring instrument housing produced by a deep-drawing process, provides a cost-effective solution for an operator control unit of a measuring instrument with an uninterrupted housing. The distortion frequently occurring due to the deep-drawing process is compensated for by the flexible printed circuit board composite, wherein the printed circuit board composite is given the necessary stability by the proportion of rigid PCB segments, which act as a kind of foundation. In particular, when the measuring instruments in question are to be used in the hygiene sector, the provision of an operator control unit at the measuring instrument regularly presents a special challenge. The invention now makes it possible to equip measuring instruments that have to be operable on site with hygienically suitable operator control units at low cost.

The invention is explained in more detail below based on exemplary embodiments with reference to the drawings.

The drawing schematically show:

FIG. 1 a measuring instrument for process measurement engineering according to the prior art;

FIG. 2 the housing head of the measuring instrument of FIG. 1 according to the prior art;

FIG. 3 a side view of a housing head comprising an operator control unit according to the invention consisting of three control panels;

FIG. 4 a top view of the housing head from FIG. 3;

FIG. 5 a sectional view through a control panel according to the invention; and

Figure 6:
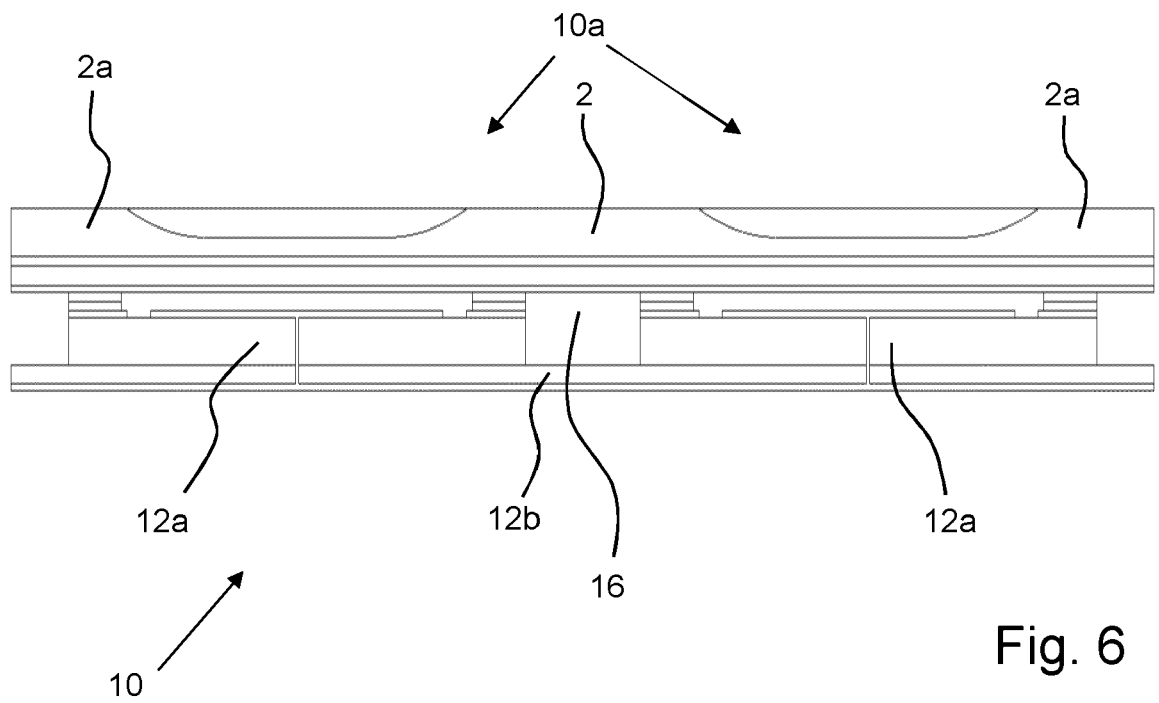

FIG. 6 a sectional view through an operator control unit according to the invention consisting of two control panels.

In the following description of the preferred embodiments, identical reference symbols denote identical or comparable components.

FIGS. 1 and 2 show a measuring instrument 1 for process measurement engineering in accordance with the prior art, in this case a pressure measuring instrument, which is sold by the applicant under the designation PNxxxx. The measuring instrument 1 essentially consists of a housing 2, which is divided into an upper part 3 and a lower part 4. The lower part, also referred to as process connection, comprises on the one hand the sensor unit, for example a pressure measuring cell in the case of a pressure measuring instrument, and on the other hand enables the mechanical connection of the measuring instrument 1 to the container or pipe containing the medium. Alternatively, in the lower part 4 there can also be provided an interface for connecting a remotely located sensor unit. In the upper part 3 the electronic unit is disposed, which is used for the evaluation and conditioning of the measurement signals supplied by the sensor unit, which can then be tapped via the plug connection shown and forwarded, for example, to a PLC.

A housing head 5, comprising among others a display device 6 and three operating elements 10 according to the invention, is mounted on the upper part 3. FIG. 2, which shows the separated housing head 5, once again clearly shows the arrangement of the display 6 and the three operating elements 10. The operating elements 10 are used to operate the measuring instrument 1, i.e. to carry out a parameterization or a setting of essential key data, such as, for example, the switching points. The respective actions are indicated to the user via the display 6.

FIGS. 3 and 4 respectively show a housing head 5 comprising an operator control unit 10 according to the invention, wherein the known operating concept with three key-type input options 10a has been adopted. In contrast to the known measuring instrument of FIGS. 1 and 2, however, no separate keys are present here, but the housing region 2a is designed around the operator control unit 10 without interruption and merely designed as a haptically perceptible depression introduced into the housing region 2a. The surface of the housing region 2a can comprise corresponding markings that enable the user to assign the housing region 2a to be actuated accordingly. The dashed circles are intended to indicate these control panels 10a. As a result, it is possible to operate the measuring instrument 1 through the closed housing wall.

FIG. 5 shows a sectional view through a control panel 10a according to the invention as a part of an operator control unit 10 consisting of several control panels 10a. Basically, the control panel 10a consists of a printed circuit board, composite 100, which abuts the inside of a housing region 2a of a measuring instrument housing 2. In the present case, the printed circuit board composite 100 is firmly bonded to the inside of the housing area 2a by means of an adhesive layer 14. However, other fastening or connection options are also conceivable, in particular pressing the printed circuit board composite 100 against the inside of the housing region 2a by means of a clamping device, e.g. in the form of spring elements.

The printed circuit board composite 100 essentially consists of a first carrier material 12, which is preferably designed in the form of a flex-rigid printed circuit board, and a second carrier material 13 in the form of a conductive layer, which is preferably formed as a conductor film. Both carrier materials 12, 13 are spaced apart from each other by a segment-like plastic layer 15 as a spacer in such a way that a measuring chamber 17 is formed between them.

In the area of a control panel 10a, the flex-rigid printed circuit board 12 comprises a flexible intermediate piece 12b, on the underside of which the actual conductor track 12c is arranged and on the upper side of which a printed circuit board segment 12a is arranged. Here, the conductor track 12c also extends transversely through the flexible intermediate piece 12b and the printed circuit board segment 12a and forms at the upper side of the printed circuit board segment 12a in the area of the measuring chamber 17 a laminar, first electrode 11a.

The opposite side of the measuring chamber 17 is formed by the conductor film 13. In this case, the polyimide carrier substrate faces the housing wall 10, 10a, while a copper layer forming the conductor track faces the measuring chamber 17. This copper layer, which is formed with a laminar shape, represents a counter-electrode 11b in the area of the measuring chamber 17.

This structure gives the printed circuit board composite 100, on the one hand, a certain flexibility which enables it to conform to the inside of the housing and to compensate for minor unevenness, in particular due to manufacturing, and, on the other hand, the necessary stability due to the proportion of rigid printed circuit board segments 12a which quasi act as a kind of foundation.

The first electrode 11a and the counter electrode 11b together form a capacitive sensor element 11 in the form of a measuring capacitor. This sensor element 11 is arranged below a deformable or elastic housing region 2a, which is deformed or deflected by the pressure of an applied finger. As a result of the firm contact of the printed circuit board composite 100 with the inside of the housing, the counter-electrode 11b is co-deformed in parallel when the housing region 2a is deformed. The deformation of the counter electrode 11b causes it to move closer to the first electrode 11a arranged parallel thereto, which leads to a change in capacitance of the formed capacitor.

The polyimide carrier of the conductor film 13 additionally acts as an electrical insulator, because the housing region 2a itself or its material has no influence on the sensor element 11. Above all, the housing region 2a itself does not represent an electrode, so that the housing can be made of any material.

For a better haptic perception and in order to create a predetermined bend point, the housing region 2a comprises a partial weakening 2b in the form of a trough-like depression above the sensor element 11.

The illustration is not to scale and is only intended to clarify the basic structure. The thickness of the housing 10, 10a is about 1 mm in the area of the depression. The overall material thickness of the housing 10 can, of course, also be higher. The conductive film 13 has a thickness in the range of about 90 μm, while the plastic layer 15 is about 50 μm thick (plus a possible adhesive layer) and the flex-rigid printed circuit board 12 has a total thickness of about 1.6 mm. The width of the measuring chamber 17 is about 13 mm.

FIG. 6 shows a sectional view through an operator control unit 10 according to the invention, consisting of two control panels 10a as shown in FIG. 5. To avoid repetition, only the additional elements will be discussed here.

It can be seen that the housing regions 2a of the two control panels 10a are arranged next to each other without interruption, so that the measuring instrument—at least in the area of the operator control unit—can be formed from a continuous housing. It can further be seen that the plastic layer 15 comprises several interruptions, not only for forming the measuring chamber 17, as already described with respect to FIG. 5, but also for forming a decoupling area 16 between the two control panels 10a, by means of which the two control panels 10a are mechanically separated from each other and a pressing of a control panel 10a is not transferred to the other. The PCB composite 100 can thus be formed as a single piece and extends across all of the control panels 10a.

The width of an operator control panel 10a is preferably about 20 mm, while the decoupling area is about 5 mm wide. The operator control unit 10 shown in FIG. 6 thus has an overall width of about 45 mm.

LIST OF REFERENCE SYMBOLS 1 measuring instrument
2 housing of the measuring instrument
2a housing region
2b partial weakening of the housing region
3 upper part
4 lower part
5 housing head
6 display
10 operator control unit
10a operating button/control panel
11 capacitive sensor element
11a first electrode
11b counter electrode
12 first carrier material, flex-rigid printed circuit board
12a printed circuit board segment
12b flexible intermediate piece
12c conductor track
13 second carder material, flexible conductor film
14 adhesive layer
15 spacer, plastic layer
16 decoupling area
17 measuring chamber
100 printed circuit board composite

The invention claimed is:

1. An operator control unit for a measuring instrument, comprising at least two operating panels (10a) arranged next to each other,
   wherein the operating panels (10a) are operated by respectively pressing on one of a shape-changing or elastic housing region (2a), each region comprising a capacitive sensor element (11) disposed underneath,
   wherein the sensor elements (11) each comprise a first electrode (11a) as a lower capacitor plate and a counter electrode (11b) arranged in parallel thereabove as an upper capacitor plate and wherein by pressing one of the housing regions (2a) an approach of the respective upper capacitor plate (11b) to the respective lower capacitor plate (11a) and thus a change in capacitance occurs,
   wherein the first electrode (11a) is applied onto a first carrier material (12) and the counter electrode (11b) is applied onto a second carrier material (13),
   wherein
   the housing regions (2a) are arranged next to one another without interruption, and wherein the sensor elements (11) are parts of a multilayer circuit board composite (100) which abuts inner sides of adjacent housing regions (2a),
   wherein the circuit board composite (100) comprises at least the first carrier material (12), which comprises several segments of rigid circuit boards with flexible intermediate pieces respectively arranged therebetween, and the second carrier material (13) in the form of a conductive layer, both of which are separated from one another by an intermediate plastic layer (15) while forming a measuring chamber (17),
   and wherein the plastic layer (15) comprises a plurality of interruptions for forming the sensor elements (11) and a decoupling area (16) between the control panels (10a).

2. The operator control unit according to claim 1, wherein the elastic housing regions (2a) each have a partial weakening (2b) in an area of the upper capacitor plate (11b), which are respectively formed as a haptically perceptible depression in an outer housing wall.

3. The operator control unit according to claim 1, wherein the circuit board composite (100) is bonded to the inner sides of the housing regions (2a).

4. The operator control unit according to claim 1, wherein the circuit board composite is pressed against the inner sides of the housing regions (2a) by means of a clamping device.

5. The operator control unit according to claim 1, wherein the conductive layer of the second carrier material (13) is formed as a conductive film.

6. The operator control unit according to claim 1, wherein the first carrier material (12) has the form of a flex-rigid circuit board.

7. The operator control unit according to claim 1, wherein the housing regions (2*a*) are formed from a metal.

8. A measuring instrument comprising a multi-part housing (2), wherein in the lower part (4) of the housing a sensor unit or an interface for connecting a sensor unit is arranged and the upper part (3) of the housing is provided for accommodating an electronic unit for evaluating the measurement signals supplied by the sensor unit, and a housing head (5) mounted on the upper part (3) of the housing (2) and comprising a display device (6) and an operator control unit (10) for operating the measuring instrument (1), wherein the operator control unit (10) is configured according to claim 1.

* * * * *